(12) United States Patent
Iwamoto

(10) Patent No.: US 9,344,047 B2
(45) Date of Patent: May 17, 2016

(54) OPERATIONAL AMPLIFIER CIRCUIT

(71) Applicant: FUJI ELECTRIC CO., LTD., Kawasaki-shi (JP)

(72) Inventor: Motomitsu Iwamoto, Matsumoto (JP)

(73) Assignee: FUJI ELECTRIC CO., LTD., Kawasaki-shi (JP)

( * ) Notice: Subject to any disclaimer, the term of this patent is extended or adjusted under 35 U.S.C. 154(b) by 119 days.

(21) Appl. No.: 14/231,810

(22) Filed: Apr. 1, 2014

(65) Prior Publication Data
US 2014/0300414 A1 Oct. 9, 2014

(30) Foreign Application Priority Data

Apr. 4, 2013 (JP) .................................. 2013-078912

(51) Int. Cl.
*H03F 3/45* (2006.01)
(52) U.S. Cl.
CPC ........ *H03F 3/45179* (2013.01); *H03F 3/45219* (2013.01); *H03F 2203/45352* (2013.01)
(58) Field of Classification Search
CPC .......................................................... H03F 3/45
USPC ................... 330/253, 255, 258, 311; 327/563
See application file for complete search history.

(56) References Cited

PUBLICATIONS

Kenji Taniguchi: "Introduction to CMOS Analogue Circuits for LSI Design" First edition, published by CQ Publishing Co. Ltd., Dec. 2004, pp. 200-204.

*Primary Examiner* — Khanh V Nguyen
*Assistant Examiner* — Khiem Nguyen
(74) *Attorney, Agent, or Firm* — Rossi, Kimms & McDowell LLP

(57) ABSTRACT

In aspects of the invention, an operational amplifier circuit includes: an N-MOS auxiliary current source connected in parallel to the N-MOS differential pair, the N-MOS auxiliary current source turning ON when the N-MOS differential pair turns OFF caused by a decreased common mode input voltage given to the pair of voltage input terminals, drawing a current from the active load for the P-MOS differential pair. Aspects of the invention also include a P-MOS auxiliary current source connected in parallel to the P-MOS differential pair, the P-MOS auxiliary current source turning ON when the P-MOS differential pair turns OFF caused by an increased common mode input voltage given to the pair of voltage input terminals, delivering a current to the active load for the-N-MOS differential pair.

7 Claims, 4 Drawing Sheets

OPERATIONAL AMPLIFIER CIRCUIT

CROSS-REFERENCE TO RELATED APPLICATION

This application is based on, and claims priority to, Japanese Patent Application No. 2013-078912, filed on Apr. 4, 2013, the contents of which are incorporated herein by reference.

BACKGROUND OF THE INVENTION

1. Field of the Invention

Embodiments of the invention relate to operational amplifier circuits that maintain a constant gain over a wide range of common mode input voltages.

2. Description of the Related Art

With the recent trends of a unipolar driving power supply and decreased power supply voltage Vdd, operational amplifier circuits of a rail-to-rail input type are drawing attention in which an input voltage range is expanded over nearly power supply voltage width of GND to Vdd. For instance, a differential input circuit, which is a MOS differential pair composed of MOS-FETs, is connected in parallel with a cascode amplification circuit to enhance a gain. A technology is further known that holds the trans-conductance gm of the MOS differential pair constant to reduce higher harmonic distortion of the output signal.

FIG. 4 shows an example of schematic construction of a conventional operational amplifier circuit of a rail-to-rail input folded cascode type. The operational amplifier circuit of FIG. 4 includes a P-MOS differential pair A for differentially amplifying an common mode input voltage given to a pair of voltage input terminals INP and INM, and an N-MOS differential pair B provided in parallel with the P-MOS differential pair A. The P-MOS differential pair A is composed of a pair of MOS-FETs of a P channel type (hereinafter referred to simply as a P-MOS) 1a and 1b, and the N-MOS differential pair B is composed of a pair of MOS-FETs of an N channel type (hereinafter referred to simply as an N-MOS) 2a and 2b.

A grounded-gate type P-MOS 3, which is connected in series to the sources of the pair of MOS-FETs 1a and 1b composing the P-MOS differential pair A, composes a P-MOS current source C for the P-MOS differential pair A. A grounded-gate type N-MOS 4, which is connected in series to the sources of the pair of MOS-FETs 2a and 2b composing the N-MOS differential pair B, composes an N-MOS current source D for the N-MOS differential pair B.

A cascode circuit of an input folded type for the P-MOS differential pair A and the N-MOS differential pair B is composed of an N-MOS cascode amplification stage E and a P-MOS cascode amplification stage F. The N-MOS cascode amplification stage E consists of an N-MOS 5a, the source of which is connected to the drain of the P-MOS 1a, and an N-MOS 5b, the source of which is connected to the drain of the P-MOS 1b. The P-MOS cascode amplification stage F consists of a pair of P-MOS 6a and P-MOS 6b that are cascode-connected to the respective drains of the N-MOS 5a and the N-MOS 5b. A pair of P-MOS 7a and P-MOS 7b forming a current mirror circuit are connected to the sources of the P-MOS 6a and the P-MOS 6b and work as a load on the P-MOS cascode amplification stage F. This pair of P-MOSes 7a and 7b is a P-MOS active load G acting on the P-MOS differential pair A. A pair of N-MOS 8a and N-MOS 8b forming a current mirror circuit are connected to the sources of the N-MOS 5a and the N-MOS 5b and work as a load on the N-MOS cascode amplification stage E. This pair of N-MOSes 8a and 8b is an N-MOS active load H acting on the N-MOS differential pair B.

The P-MOS active load G acting on the P-MOS differential pair A works also as a current source for the N-MOS differential pair B; and the N-MOS active load H acting on the N-MOS differential pair B works also as a current source for the P-MOS differential pair A. In short, the P-MOSes 7a and 7b work simultaneously as a P-MOS active load G on the P-MOS differential pair A and as a current source for the N-MOS differential pair B; and the N-MOSes 8a and 8b work simultaneously as an N-MOS active load H on the N-MOS differential pair B and as a current source for the P-MOS differential pair A.

The current as indicated in FIG. 4 flows through the P-MOS differential pair A and the N-MSO differential pair B when the common mode input voltages given to the voltage input terminals INP and INM are equal to each other and the voltages are not approximately equal to the ground potential GND, zero volts, and not near the power supply voltage Vdd. The current I3 flows through the P-MOS current source C composed of the P-MOS 3; the current I4 flows through the N-MOS current source D composed of the N-MOS 4; and the current I7 flows through the P-MOS active load G composed of the P-MOSes 7a and 7b.

In the operational amplifier circuit provided with the P-MOS differential pair A and the N-MOS differential pair B connected together in parallel, either one of the P-MOS differential pair A and the N-MOS differential pair B operates normally in the input voltage range of the ground potential GND to the power supply voltage Vdd. Since an input voltage can be amplified in an input voltage range of approximately the power supply voltage width, from GND to Vdd, the operational amplifier circuit is called a rail-to-rail input type operational amplifier circuit.

The cascode circuit is composed of the N-MOS cascode amplification stage E and the P-MOS cascode amplification stage F and forms a grounded-gate amplifier circuit. The cascode circuit amplifies by folding the current flowing through the P-MOS differential pair A and the N-MOS differential pair B raising the output resistance and enhances the gain of the operational amplifier circuit. Kenji TANIGUCHI: "Introduction to CMOS Analogue Circuits for LSI Design" (in Japanese) First edition, published by CQ Publishing Co. Ltd., December 2004, pages 200-204 (also referred to herein as "Non-patent Document 1") discloses in detail about an operational amplifier circuit of a rail-to-rail input folded cascode type.

In the operational amplifier having a construction described above, when the common mode input voltage is approximately equal to the power supply voltage Vdd, the N-MOS differential pair B solely operates; and the common mode input voltage is approximately equal to the ground potential GND zero volts, the P-MOS differential pair A solely operates. In these cases, different from the case in which the common mode input voltage is in an ordinary state and both the P-MOS deferential pair A and the N-MOS differential pair are operating, the bias conditions have been changed for the P-MOS differential pair A and the N-MOS differential pair B, resulting in variation of the gain of the operational amplifier circuit.

A gain 'Gain' of the operational amplifier circuit having the construction described above is represented by the following equations:

$$\text{Gain} = (g\,mp + g\,mn)/(X+Y),$$

$$X = (g\,d6/g\,m6)(g\,dn + g\,d7), \text{ and}$$

$$Y = (g\,d5/g\,m5)(g\,dp + g\,d8).$$

In these equations, g mp is a trans-conductance of the P-MOS differential pair A and g dp is a drain conductance of the P-MOS differential pair A; and g mn is a trans-conductance of the N-MOS differential pair B and g dn is a drain conductance of the N-MOS differential pair B. g m6 and g d6 are a trans-conductance and a drain conductance, respectively, of the P-MOS 6a of the P-MOS cascode amplification stage F; and g m5 and g d5 are trans-conductance and the drain conductance, respectively, of the N-MOS 5a of the N-MOS cascode amplification stage E. g d7 is a drain conductance of the P-MOSes 7a and 7b of the active load G for the P-MOS differential pair, and g d8 is a drain conductance of the N-MOSes 8a and 8b of the active load H for the N-MOS differential pair.

When the common mode input voltage is low to turning the N-MOS differential pair B OFF, the trans-conductance g mn and the drain conductance g do of the N-MOS differential pair B becomes zero, resulting in decrease in the numerator term in the above equation. Here, the current drawn out by the N-MOS differential pair B decreases, increasing the bias current through the active loads G and H. As a result, the drain conductances g d7 and g d8 increases, lowering the gains of the cascode circuits E and F, which increases the denominator term of the above equation resulting in lowering the Gain of the operational amplifier circuit.

To deal with this problem, a measure as shown in FIG. 5 has been proposed in which constant trans-conductance circuits J and K are provided for the P-MOS differential pair A and the N-MOS differential pair B, respectively. The constant trans-conductance circuit J is a P-MOS differential pair compensating circuit to maintain the trans-conductance g mp of the differential pair A and the constant trans-conductance circuit K is an N-MOS differential pair compensating circuit to maintain the trans-conductance g mn of the differential pair B. When one of the P-MOS differential pair A and the N-MOS differential pair B has turned OFF, the constant trans-conductance circuits J and K supply twice the current in an normal state to the differential pair that stays in an ON state, avoiding decrease in the Gain. This measure is disclosed in Non-Patent Document 1, for example.

The constant trans-conductance circuit J for P-MOS differential pair compensation is composed of a pair of P-MOSes 9a and 9b that form a current mirror circuit and delivers a current to the P-MOS differential pair A and an N-MOS 9c that regulates a current through the current mirror circuit corresponding to the current in the N-MOS differential pair B. The ratio of the currents in the constant trans-conductance circuit J is set at [I4: 3 I3]. The constant trans-conductance circuit K for N-MOS differential pair compensation is composed of a pair of N-MOSes 10a and 10b that form a current mirror circuit and draws a current from the N-MOS differential pair B and an P-MOS 10c that regulates a current through the current mirror circuit corresponding to the current in the P-MOS differential pair A. The ratio of the currents in the constant trans-conductance circuit K is set at [I3: 3 I4].

As shown in FIG. 5, which indicates the current flow in the state of the P-MOS differential pair A OFF, the constant trans-conductance circuit K for compensating the N-MOS differential pair operates to deliver the four times as much as the current in a normal state to the N-MOS differential pair B when the P-MOS differential pair A turns OFF. Similarly, the constant trans-conductance circuit J for compensating the P-MOS differential pair operates to deliver the four times as much as the current in a normal state to the P-MOS differential pair A when the N-MOS differential pair B turns OFF. Here, because the trans-conductances g m of the P-MOS differential pair A and the N-MOS differential pair B are each proportional to the square root of the current in the P-MOS differential pair A and the N-MOS differential pair B, respectively, the trans-conductances gm each becomes twice when the current becomes four times.

The constant trans-conductance circuit J for compensating the P-MOS differential pair and the constant trans-conductance circuit K for compensating the N-MOS differential pair operating as described above hold the magnitude of the numerator term of the above equation irrespective of the variation of the common mode input voltage. Therefore, the Gain of the operational amplifier circuit is held constant.

In the operational amplifier circuit of a rail-to-rail input folded cascode type having the constant trans-conductance circuits J and K, however, when one of the MOS differential pairs A and B is in an OFF state, the other MOS differential pair needs to carry four times as much current as the current in the normal state. As a result, the active loads G and H must carry at least four times current of the current through the P-MOS differential pair A and through the N-MOS differential pair B. This detracts from freedom of circuit design and hinders reduction of power consumption.

The operational amplifier circuit having the construction as described above is theoretically possible to make the numerator term of the equation mentioned previously constant to maintain a constant gain. However, the variation of the current flowing through the active loads G and H and through the cascode amplification stages E and F changes the apparent drain conductances g d of the P-MOSes 6a and 7a and N-MOSes 5a and 8a composing the active loads G and H and the cascode amplification stages E and F. Consequently, the denominator term of the equation changes and eventually changes the gain of the operational amplifier circuit.

SUMMARY OF THE INVENTION

Embodiments of the invention address the above-described and other shortcomings in the related art. Embodiments of the invention provide an operational amplifier circuit with a simple construction in which power consumption is reduced and the gain of the circuit is held constant in a wide range of common mode input voltages.

In some embodiments, an operational amplifier circuit of the invention comprises: an N-MOS differential pair composed of a pair of N-channel type MOS-FETs connected to a pair of voltage input terminals; an active load for a P-MOS differential pair connected to the N-MOS differential pair and a current source for the N-MOS differential pair connected to the N-MOS differential pair; the P-MOS differential pair composed of a pair of P-channel type MOS-FETs connected to the pair of voltage input terminals; an active load for the N-MOS differential pair connected to the P-MOS differential pair and a current source for the P-MOS differential pair connected to the P-MOS differential pair; an N-MOS auxiliary current source composed of a pair of N-channel type MOS-FETs that are connected in parallel to the pair of N channel type MOS-FETs composing the N-MOS differential pair and have a gate biased at a voltage slightly higher than a voltage that turns OFF the pair of N-channel type MOS-FETs composing the N-MOS differential pair; and a P-MOS auxiliary current source composed of a pair of P-channel type MOS-FETs that are connected in parallel to the pair of P channel type MOS-FETs composing the P-MOS differential pair and have a gate biased at a voltage slightly lower than a voltage that turns OFF the pair of P-channel type MOS-FETs composing the P-MOS differential pair.

The wording "slightly higher voltage" and "slightly lower voltage" in the above statements means such bias voltages that operates the MOS-FETs of the MOS differential pairs and the MOS auxiliary current sources alternatively at the virtually same time and with a very small difference in the voltage level without any hindrance to the overall operation of the operational amplifier circuit. More specifically, the difference in the bias voltages is for example in the range of 1 to 5 mV depending on the operational characteristics of the MOS-FETs.

The N-MOS auxiliary current source turns ON when the N-MOS differential pair turns OFF caused by a decreased common mode input voltage given to the pair of voltage input terminals, drawing a current from the active load for the P-MOS differential pair and, the P-MOS auxiliary current source turns ON when the P-MOS differential pair turns OFF caused by an increased common mode input voltage given to the pair of voltage input terminals, delivering a current to the active load for the P-MOS differential pair In some embodiments, the active load for the-P-MOS differential pair and the current source for the N-MOS differential pair are actualized simultaneously by a pair of P channel type MOS-FETs connected in series to the pair of N channel type MOS-FETs composing the N-MOS differential pair.

In some embodiments, the active load for the N-MOS differential pair and the current source for the P-MOS differential pair are actualized simultaneously by a pair of N channel type MOS-FETs connected in series to the pair of P channel type MOS-FETs composing the P-MOS differential pair.

In some embodiments, the N-MOS auxiliary current source draws a current from the active load for the P-MOS differential pair when the N-MOS differential pair turns OFF to maintain a current that was flowing through the active load for the P-MOS differential pair before the N-MOS differential pair turns OFF.

In some embodiments, the P-MOS auxiliary current source draw a current from the active load on the P-MOS differential pair when the P-MOS differential pair turns OFF to maintain a current that was flowing through the active load on the P-MOS differential pair before the P-MOS differential pair turns OFF.

In some embodiments, the operational amplifier circuit composes a rail-to-rail input folded type circuit and further comprises an N-MOS cascode amplification stage and a P-MOS cascode amplification stage that are parallel-connected to the N-MOS differential pair and the P-MOS differential pair, respectively, the N-MOS cascode amplification stage being composed of a pair of N channel type MOS-FETs and the P-MOS cascode amplification stage being composed of a pair of P channel type MOS-FETs.

In some embodiments of the operational amplifier circuit having the construction described above, immediately before the P-MOS differential pair turns OFF due to increased common mode input voltage, the P-MOS auxiliary current source connected in parallel with the P-MOS differential pair turns ON and then P-MOS differential pair turns OFF. As a consequence, although the current through the P-MOS differential pair becomes zero, the current that was flowing through the P-MOS differential pair before turning OFF of the pair continues to flow through the P-MOS auxiliary current source and the current source for the P-MOS differential pair.

On the other hand, immediately before the N-MOS differential pair turns OFF due to decreased common mode input voltage, the N-MOS auxiliary current source connected in parallel with the N-MOS differential pair turns ON and then N-MOS differential pair turns OFF. As a consequence, although the current through the N-MOS differential pair becomes zero, the current that was flowing through the N-MOS differential pair before turning OFF of the pair continues to flow through the N-MOS auxiliary current source and the current source for the N-MOS differential pair.

Thus, even if one of the P-MOS differential pair and the N-MOS differential pair turns OFF, it does not cause change in the trans-conductance and the drain conductance of the current source for the P-MOS differential pair and the current source for the N-MOS differential pair. Therefore, an operational amplifier circuit of the invention avoids lowering of the gain in the event of turning OFF of one of the P-MOS differential pair and the N-MOS differential pair, while restricting the current through the P-MOS differential pair, the N-MOS differential pair, the active load on the N-MOS differential pair, and the active load on the P-MOS differential pair. Thus, great advantages in practical application are brought about including a lowered current with a simple circuit construction.

DETAILED DESCRIPTION OF THE INVENTION

The following describes in detail an operational amplifier circuit according to a embodiments of the invention with reference to the accompanying drawings.

Figure 1:
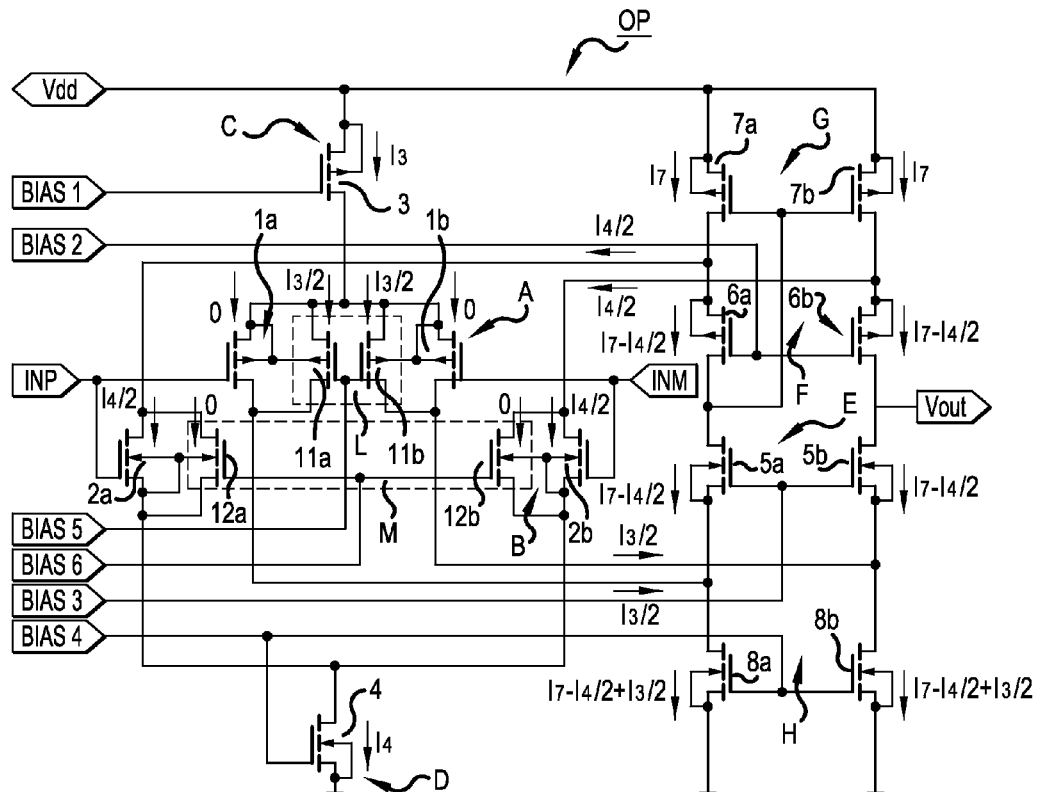
FIG. 1 shows a schematic construction of an example of an operational amplifier circuit of a rail-to-rail input folded cascode type according to an embodiment of the invention.
Figure 5:
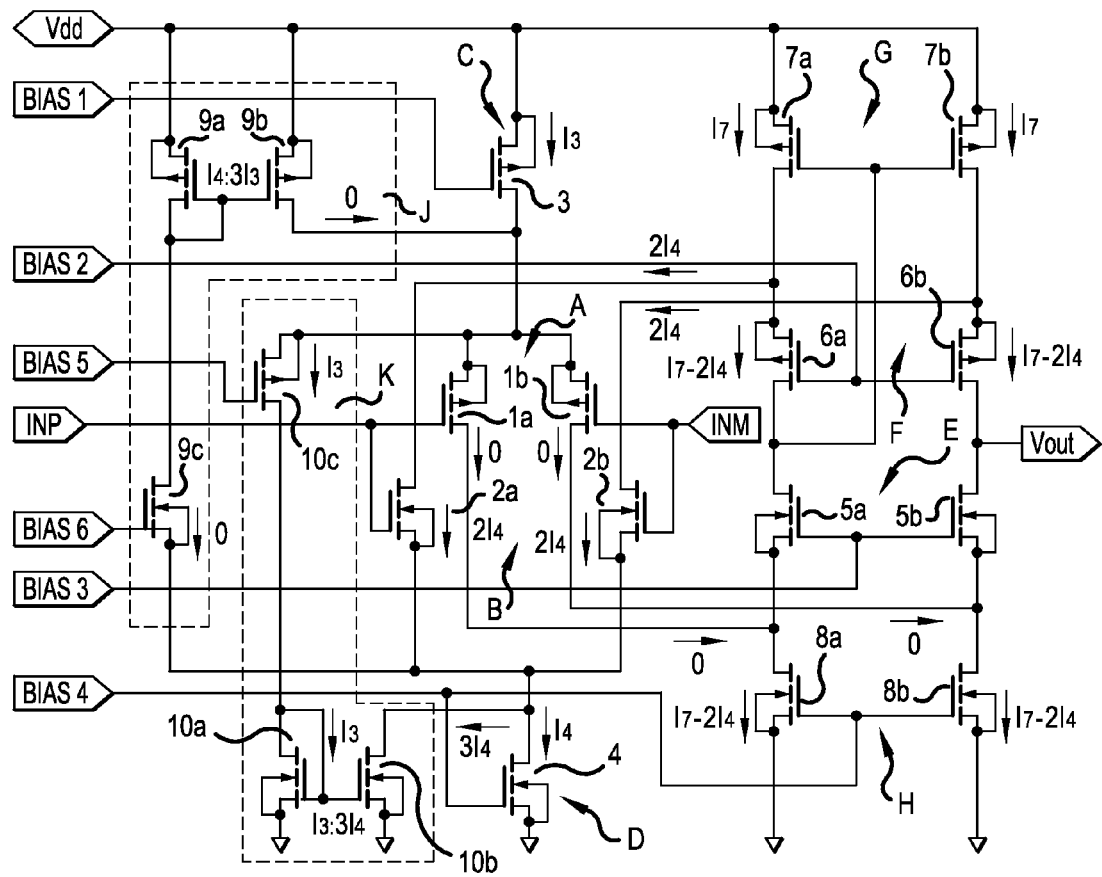
FIG. 5 shows a schematic construction of an example of an operational amplifier circuit of a rail-to-rail input folded cascode type having a constant trans-conductance circuit for a differential pair.

FIG. 1 shows a schematic construction of an operational amplifier circuit OP of a rail-to-rail input folded cascode type according to an embodiment of the invention. The same parts in FIG. 1 as those of the conventional amplifier circuit shown in FIG. 5 are given the same symbols and repeated description is avoided.

An operational amplifier circuit OP according to this embodiment is characterized in that a P-MOS auxiliary current source L and an N-MOS auxiliary current source M are provided in place of the constant trans-conductance circuit J for compensating the P-MOS differential pair and the constant trans-conductance circuit K for compensating the N-MOS differential pair. The P-MOS auxiliary current source L turns ON when the common mode input voltage increases to turn OFF the P-MOS differential pair A, drawing a current from the active load G for the P-MOS differential pair.

The N-MOS auxiliary current source M turns ON when the common mode input voltage decreases to turn OFF the N-MOS differential pair B, delivering a current to the active load H for the N-MOS differential pair.

The P-MOS auxiliary current source L is composed of a pair of P-MOSes 11*a* and 11*b* that are connected in parallel to the P-MOSes 1*a* and 1*b* composing the P-MOS differential pair A. The gates of the P-MOSes 11a and 11b are biased at a voltage slightly lower than the voltage that turns OFF the P-MOSes 1a and 1b. The P-MOSes 1a and 1b and the P-MOSes 11a and 11b have favorably a uniform characteristic.

The P-MOS auxiliary current source L turns ON immediately before the P-MOS differential pair A turns OFF caused by the increased common mode input voltage. When the P-MOS differential pair A turns OFF and the current through the P-MOS differential pair A has decreased to zero, the current from the current source C for the P-MOS differential pair continues to flow through the P-MOS auxiliary current source L. As a result of the turning ON of the P-MOS auxiliary current source L, the current source C for the P-MOS differential pair continues to carry the current that was running before the P-MOS differential pair A turns OFF.

The N-MOS auxiliary current source M is composed of a pair of N-MOSes 12a and 12b that are connected in parallel to the N-MOSes 2a and 2b composing the N-MOS differential pair B. The gates of the N-MOSes 12a and 12b are biased at a voltage slightly higher than the voltage that turns OFF the N-MOSes 2a and 2b. The N-MOSes 2a and 2b and the N-MOSes 12a and 12b have favorably a uniform characteristic.

The N-MOS auxiliary current source M turns ON immediately before the N-MOS differential pair B turns OFF caused by the decreased common mode input voltage. When the N-MOS differential pair B turns OFF and the current through the N-MOS differential pair B has decreased to zero, the current to the current source D for the N-MOS differential pair continues to flow through the N-MOS auxiliary current source M. As a result of the turning ON of the N-MOS auxiliary current source M, the current source D for the N-MOS differential pair continues to carry the current that was running before the N-MOS differential pair B turns OFF.

FIG. 1 indicates the current flow in the OFF state of the P-MOS differential pair A when the common mode input voltage has increased. The current I3 that was flowing through the P-MOS differential pair A before the P-MOS differential pair A turns OFF flows into the P-MOS auxiliary current source L in place of the P-MOS differential pair A. Consequently, the current I3 flowing through the P-MOS current source C does not change. Since the N-MOS differential pair B is in an ON state, the N-MOS current source D continues to carry the current I4. Therefore, the total current does not change flowing through the parallel circuit consisting of the P-MOS differential pair A, the N-MOS differential pair B, the P-MOS auxiliary current source L, and the N-MOS auxiliary current source M.

Consequently, the current I7 flowing through the P-MOS active load G does not change from the state before the P-MOS differential pair A turns OFF, and the current flowing through the N-MOS active load H does not change from the state before the P-MOS differential pair A turns OFF. A current at a magnitude of [I7−I4/2] flows through each of the P-MOSes 6a and 6b composing the P-MOS cascode amplification stage F and the N-MOSes 5a and 5b composing the N-MOS cascode amplification stage E. A current at a magnitude of [I7−I4/2+I3/2] flows through the N-MOSes 8a and 8b composing the N-MOS active load H.

Similarly, when the common mode input voltage has decreased causing the N-MOS differential pair B turning OFF, the current I4 that was flowing through the N-MOS differential pair B before the N-MOS differential pair B turns OFF flows into the N-MOS auxiliary current source M in place of the N-MOS differential pair B. Consequently, the current I4 flowing through the N-MOS current source D does not change. Therefore, the total current does not change flowing through the parallel circuit consisting of the P-MOS differential pair A, the N-MOS differential pair B, the P-MOS auxiliary current source L, and the n-MOS auxiliary current source M.

In the operational amplifier circuit OP operating as describe above, the numerator in the equation representing the gain mentioned previously turns out to be zero since both the trans-conductances g mp and g mn are zero, where the g mp is the trans-conductance of the P-MOS differential pair A and the g mn is the trans-conductance of the N-MOS differential pair B. However, in place of the trans-conductances g mp and g mn of the MOS differential pairs A and B, trans-conductances g mp' and g mn' work where the g mp', which is equal to g mp, is a trans-conductance of the P-MOS auxiliary current source L and g mn', which is equal to g mn, is a trans-conductance of the N-MOS auxiliary current source M. Therefore, the numerator term of the equation does not change.

Since the operation conditions do not change for the P-MOS cascode amplification stage F, the N-MOS cascode amplification stage E, the P-MOS active load G, and the N-MOS active load H, the trans-conductance g m6 of the P-MOS 6a and other parameters do not change. Consequently, even though one of the P-MOS differential pair A and the N-MOS differential pair B turns OFF, the Gain of the operational amplifier circuit OP is maintained at the value before the one of the MOS differential pairs A and B turns OFF. In other words, the Gain of the operational amplifier circuit OP according to the embodiment of the invention is maintained at a constant value irrespective of the turning OFF of the one of the MOS differential pairs A and B.

Now, the following equations are supposed.

$g\ mp = g\ mn = a,$ $(g\ d6/g\ m6) = (g\ d5/g\ m5) = b,$ and $g\ dn = g\ d7 = g\ dp = g\ d8 = c.$ Then, the Gain of the operational amplifier circuit OP in a normal state is represented by the equation:

$\text{Gain} = a/(2bc).$

The normal state means that the common mode input voltage is not at a voltage approximately the ground potential GND, zero volts, nor at a voltage approximately the power supply voltage Vdd.

When the common mode input voltage becomes a voltage approximately equal to the ground potential GND, zero volts, or the power supply voltage Vdd, and one of the MOS differential pairs A and B has turned OFF, the Gain' of the operational amplifier circuit in this case becomes:

$\text{Gain}' = a/(3bc).$

As a consequence, the Gain of the operational amplifier circuit is reduced at the rate of ⅔ when one of the MOS differential pairs A and B turns OFF. This rate corresponds to a decrease in the output voltage level of only about −3.5 dB. Thus, the operational amplifier circuit OP having the construction described above does not increase the current flowing through the MOS differential pairs A and B and the current flowing through the active loads H and G. Therefore, the operational amplifier circuit OP of the invention achieves low power consumption and effectively restricts the change of the gain caused by the change of common mode input voltage.

Figure 2:
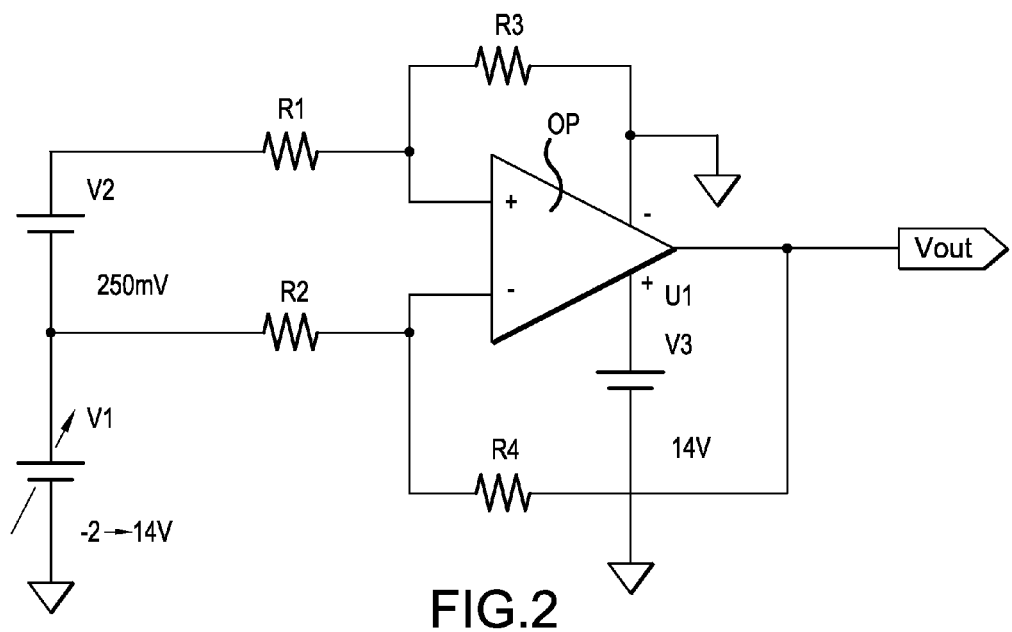
FIG. 2 shows an experimental circuit used for obtaining an input-output characteristic of the operational amplifier circuit shown in FIG. 1.

FIG. 2 shows an experimental circuit used for measuring input-output characteristic of the operational amplifier circuit OP of the invention. The experimental circuit of FIG. 2 comprises input resistors R1 and R2 of 10 kΩ and feedback resistors R3 and R4 of 80 kΩ. Thus, the experimental circuit constructs a differential amplifier circuit with an amplification factor of 8. Variation of output voltage was measured while changing a common mode input voltage having a potential difference of 250 mV from −2 V to 14 V, which is the power supply voltage Vdd.

Figure 3:
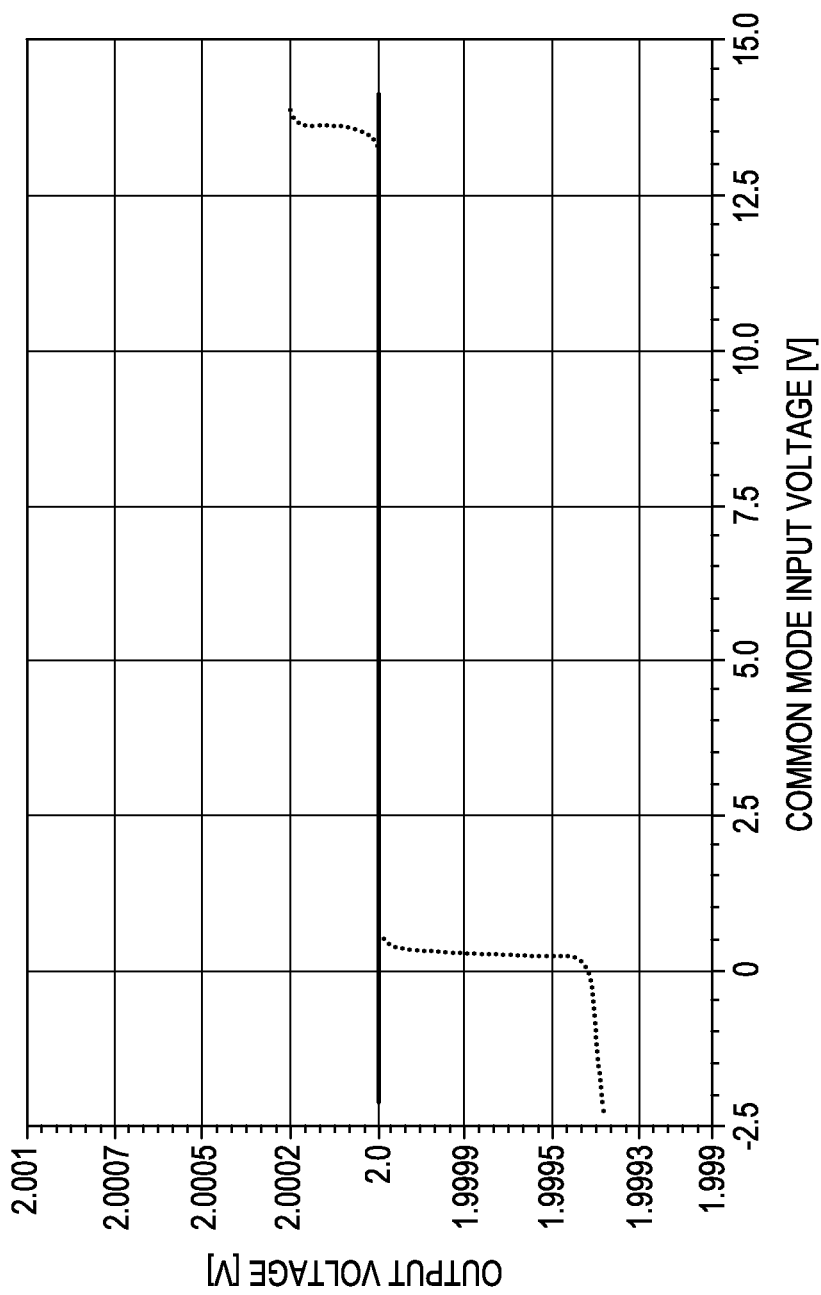
FIG. 3 shows the input-output characteristic obtained with the experimental circuit shown in FIG. 2 in the operational amplifier circuit according to an embodiment of the invention.

FIG. 3 shows the output voltage Vout corresponding to the change of the common mode input voltage obtained with the experimental circuit.

Figure 4:
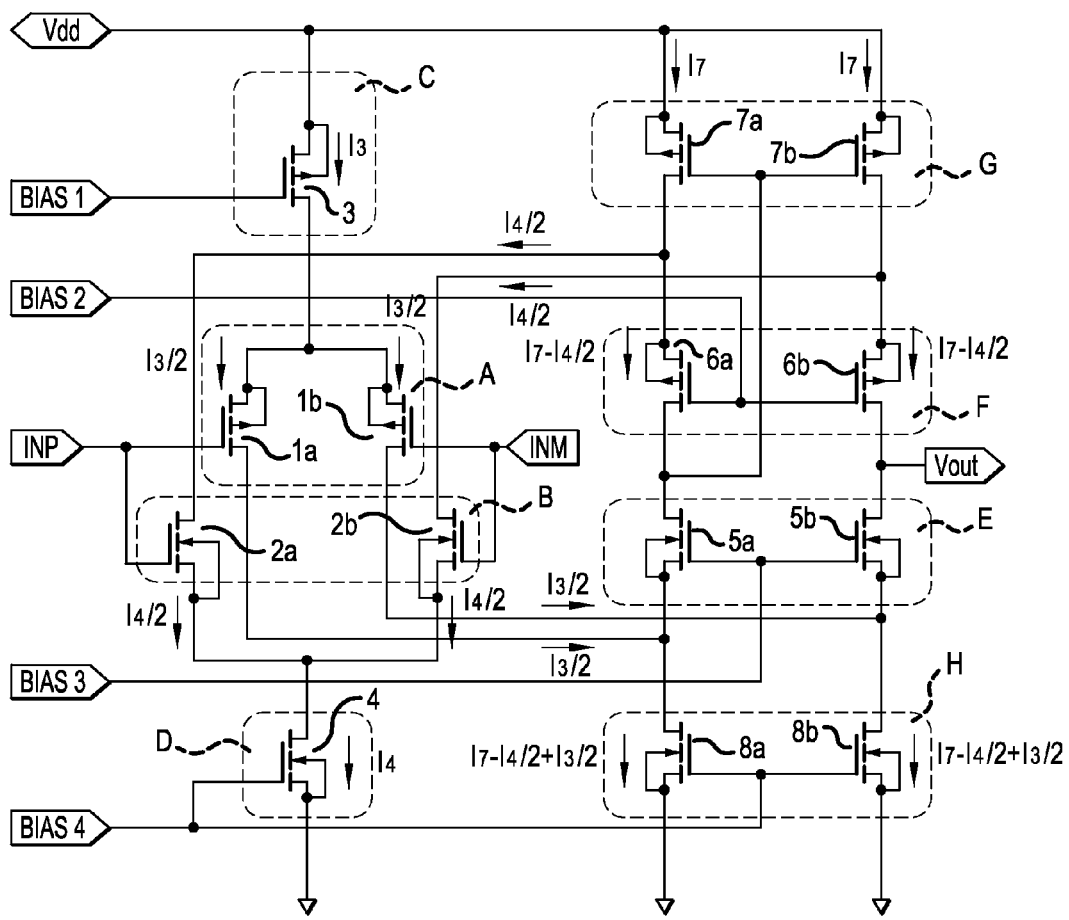
FIG. 4 shows a schematic construction of an example of an operational amplifier circuit of a rail-to-rail input folded cascode type according to a conventional technology.

The dotted curve shows an input-output characteristic measured for the conventional circuit shown in FIG. 4. As shown by the experimental result, it has been certified that the output voltage Vout in the operational amplifier circuit OP of the invention is maintained constant over the wide range of common mode input voltages from −2 V to 14 V. In contrast, for the conventional circuit, the output voltage Vout abruptly drops when the common mode input voltage decreases below 0.75 V, and the output voltage Vout rapidly rises when the common mode input voltage increases above 13.5 V. Thus, it has been assured that the gain of the operational amplifier circuit OP of the invention is held stably over the wide range of common mode input voltage.

It should be understood that the invention does not limited to the embodiment described thus far. For example, the current I7 through the P-MOSes 7a and 7b composing the P-MOS active load G and the current I8 through the N-MOSes 8a and 8b composing the N-MOS active load H can be appropriately determined according to the requirements for the P-MOS cascode amplification stage F and the N-MOS cascode amplification stage E. Thus, the freedom of design for the cascode circuit has been sufficiently extended.

The P-MOSes 11a and 11b composing the P-MOS auxiliary current source L are sufficient if they have a uniform characteristic and exhibit a larger current carrying capacity than the P-MOSes 1a and 1b composing the P-MOS differential pair A. The N-MOSes 12a and 12b composing the N-MOS auxiliary current source M are sufficient if they have a uniform characteristic and exhibit a larger current carrying capacity than the N-MOSes 2a and 2b composing the N-MOS differential pair B. Any other variations and modifications can be performed without departing from the spirit and scope of the invention.

What is claimed is:

1. An operational amplifier circuit comprising:
   an N-MOS differential pair composed of a pair of N-channel type MOS-FETs connected to a pair of voltage input terminals;
   an active load for a P-MOS differential pair connected to the N-MOS differential pair and a current source for the N-MOS differential pair connected to the N-MOS differential pair;
   the P-MOS differential pair composed of a pair of P-channel type MOS-FETs connected to the pair of voltage input terminals;
   an active load for the N-MOS differential pair connected to the P-MOS differential pair and a current source for the P-MOS differential pair connected to the P-MOS differential pair;
   an N-MOS auxiliary current source composed of a pair of N-channel type MOS-FETs that are connected in parallel to the pair of N channel type MOS-FETs composing the N-MOS differential pair and have a gate biased at a voltage slightly higher than a voltage that turns OFF the pair of N-channel type MOS-FETs composing the N-MOS differential pair; and
   a P-MOS auxiliary current source composed of a pair of P-channel type MOS-FETs that are connected in parallel to the pair of P channel type MOS-FETs composing the P-MOS differential pair and have a gate biased at a voltage slightly lower than a voltage that turns OFF the pair of P-channel type MOS-FETs composing the P-MOS differential pair.

2. The operational amplifier circuit according to claim 1, wherein
   the N-MOS auxiliary current source turns ON when the N-MOS differential pair turns OFF caused by a decreased common mode input voltage given to the pair of voltage input terminals, drawing a current from the active load for the P-MOS differential pair and
   the P-MOS auxiliary current source turns ON when the P-MOS differential pair turns OFF caused by an increased common mode input voltage given to the pair of voltage input terminals, delivering a current to the active load for the N-MOS differential pair.

3. The operational amplifier circuit according to claim 1, wherein the active load for the P-MOS differential pair and the current source for the N-MOS differential pair are actualized simultaneously by a pair of P channel type MOS-FETs connected in series to the pair of N channel type MOS-FETs composing the N-MOS differential pair.

4. The operational amplifier circuit according to claim 1, wherein the active load for the N-MOS differential pair and the current source for the P-MOS differential pair are actualized simultaneously by a pair of N channel type MOS-FETs connected in series to the pair of P channel type MOS-FETs composing the P-MOS differential pair.

5. The operational amplifier circuit according to claim 1, wherein the N-MOS auxiliary current source draws a current from the active load for the P-MOS differential pair when the N-MOS differential pair turns OFF to maintain a current that was flowing through the active load for the P-MOS differential pair before the N-MOS differential pair turns OFF.

6. The operational amplifier circuit according to claim 1, wherein the P-MOS auxiliary current source delivers a current to the active load for the-N-MOS differential pair when the P-MOS differential pair turns OFF to maintain a current that was flowing through the active load for the N-MOS differential pair before the P-MOS differential pair turns OFF.

7. The operational amplifier circuit according to claim 1, composing a rail-to-rail input folded type circuit and further comprising an N-MOS cascode amplification stage and a P-MOS cascode amplification stage that are parallel-connected to the N-MOS differential pair and the P-MOS differential pair, respectively, the N-MOS cascode amplification stage being composed of a pair of N channel type MOS-FETs and the P-MOS cascode amplification stage being composed of a pair of P channel type MOS-FETs.

* * * * *